United States Patent
Song et al.

(10) Patent No.: US 11,903,243 B2
(45) Date of Patent: Feb. 13, 2024

(54) OPTICAL FILM

(71) Applicant: LG CHEM, LTD., Seoul (KR)

(72) Inventors: Jin Suk Song, Daejeon (KR); Min Soo Song, Daejeon (KR); Sang Choll Han, Daejeon (KR)

(73) Assignee: LG CHEM, LTD., Seoul (KR)

( * ) Notice: Subject to any disclaimer, the term of this patent is extended or adjusted under 35 U.S.C. 154(b) by 205 days.

(21) Appl. No.: 16/772,933

(22) PCT Filed: Dec. 26, 2018

(86) PCT No.: PCT/KR2018/016660
§ 371 (c)(1),
(2) Date: Jun. 15, 2020

(87) PCT Pub. No.: WO2019/135539
PCT Pub. Date: Jul. 11, 2019

(65) Prior Publication Data
US 2021/0167334 A1    Jun. 3, 2021

(30) Foreign Application Priority Data

Jan. 3, 2018 (KR) .................... 10-2018-0000786

(51) Int. Cl.
*G02B 5/32* (2006.01)
*H10K 50/858* (2023.01)

(52) U.S. Cl.
CPC ............. *H10K 50/858* (2023.02); *G02B 5/32* (2013.01)

(58) Field of Classification Search
CPC ...... G02B 5/32; G02B 3/0087; G02B 3/0081; G02B 5/20; G03H 2250/00; G03H 2240/54; H01L 51/5275; H01L 51/50
See application file for complete search history.

(56) References Cited

U.S. PATENT DOCUMENTS

| | | | |
|---|---|---|---|
| 4,968,117 A * | 11/1990 | Chern | B01J 12/02 359/630 |
| 9,151,888 B2 * | 10/2015 | Mori | G02B 6/028 |
| 2007/0242364 A1 * | 10/2007 | Matsuura | G02B 5/1857 359/652 |
| 2010/0039707 A1 | 2/2010 | Akahane et al. | |
| 2010/0182222 A1 | 7/2010 | Ichihashi et al. | |
| 2014/0306193 A1 | 10/2014 | Lee et al. | |
| 2014/0313584 A1 * | 10/2014 | Hanada | G02B 1/041 359/571 |
| 2017/0133637 A1 * | 5/2017 | Kim | G02B 3/08 |

(Continued)

FOREIGN PATENT DOCUMENTS

| | | |
|---|---|---|
| CN | 1498046 A | 5/2004 |
| CN | 1666578 A | 9/2005 |

(Continued)

*Primary Examiner* — Jade R Chwasz
(74) *Attorney, Agent, or Firm* — Bryan Cave Leighton Paisner LLP

(57) ABSTRACT

An optical film including a refractive index changing unit region comprising at least one high-refraction unit region and at least one low-refraction unit region, the refractive index changing unit region in which a refractive index varies along the plane direction, is provided. The optical film has excellent abrasion resistance and pressure resistance while having excellent light extraction efficiency.

16 Claims, 10 Drawing Sheets

(56) References Cited

U.S. PATENT DOCUMENTS

2018/0372958 A1* 12/2018 Karafin ................ H04N 13/388
2019/0006628 A1    1/2019 Huang et al.
2019/0170919 A1*  6/2019 Saitoh .................. G02B 3/0087

FOREIGN PATENT DOCUMENTS

| | | | |
|---|---|---|---|
| CN | 1758819 A | | 4/2006 |
| CN | 105247702 A | | 1/2016 |
| CN | 106299145 A | | 1/2017 |
| EP | 1696249 A1 | | 8/2006 |
| JP | 2002139628 A | | 5/2002 |
| JP | 2008189914 A | | 8/2008 |
| JP | 2010-135212 A | | 6/2010 |
| JP | 2011181269 A | | 9/2011 |
| JP | 2015534135 A | * | 11/2015 |
| KR | 10-0682721 B1 | | 2/2007 |
| KR | 10-2009-0120956 A | | 11/2009 |
| KR | 10-2014-0143101 A | | 12/2014 |
| KR | 10-2015-0043860 A | | 4/2015 |
| KR | 10-2015-0064203 A | | 6/2015 |
| KR | 10-1896038 B1 | | 9/2018 |
| WO | 2010004753 A1 | | 1/2010 |
| WO | 2016133643 A2 | | 8/2016 |
| WO | 2016133643 A3 | | 8/2016 |

* cited by examiner

[Figure 1]
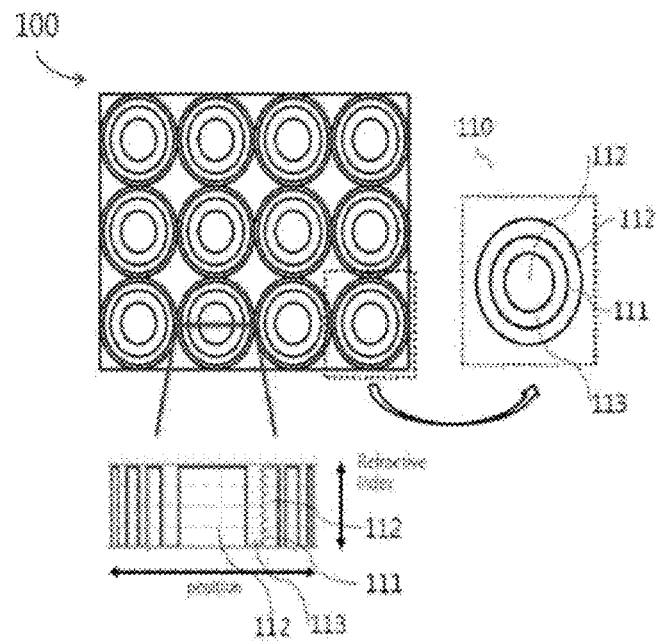
[Figure 2]
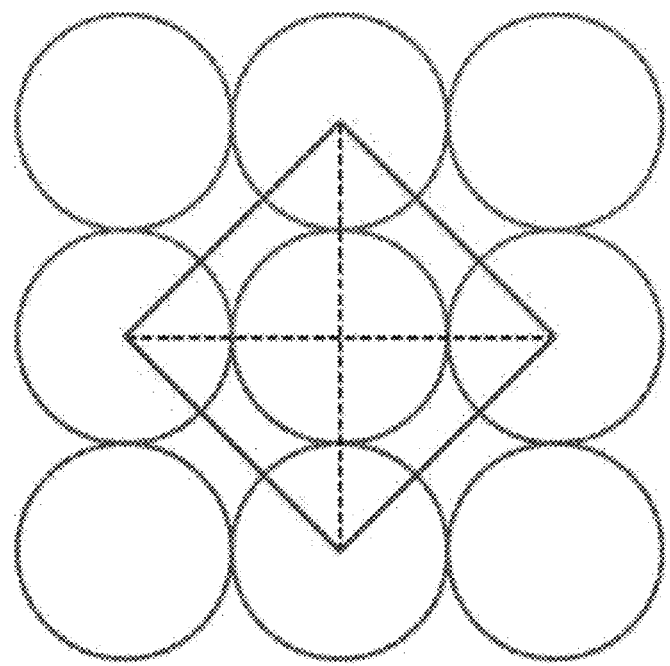

[Figure 3]
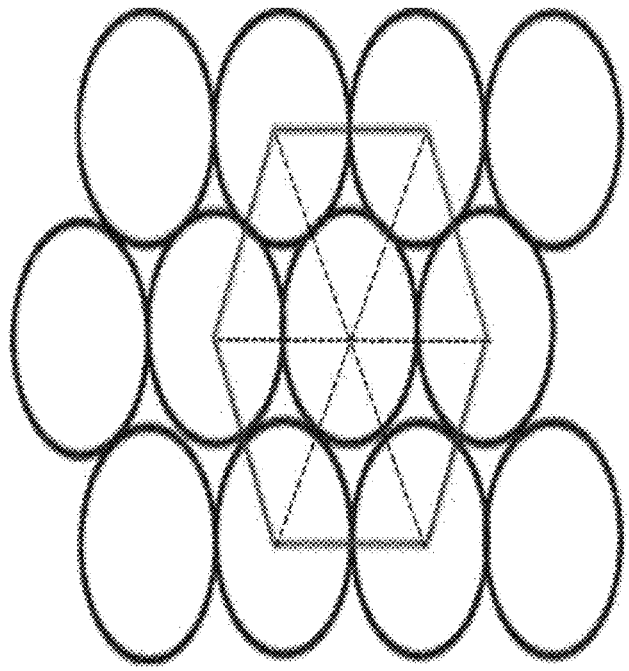
[Figure 4]
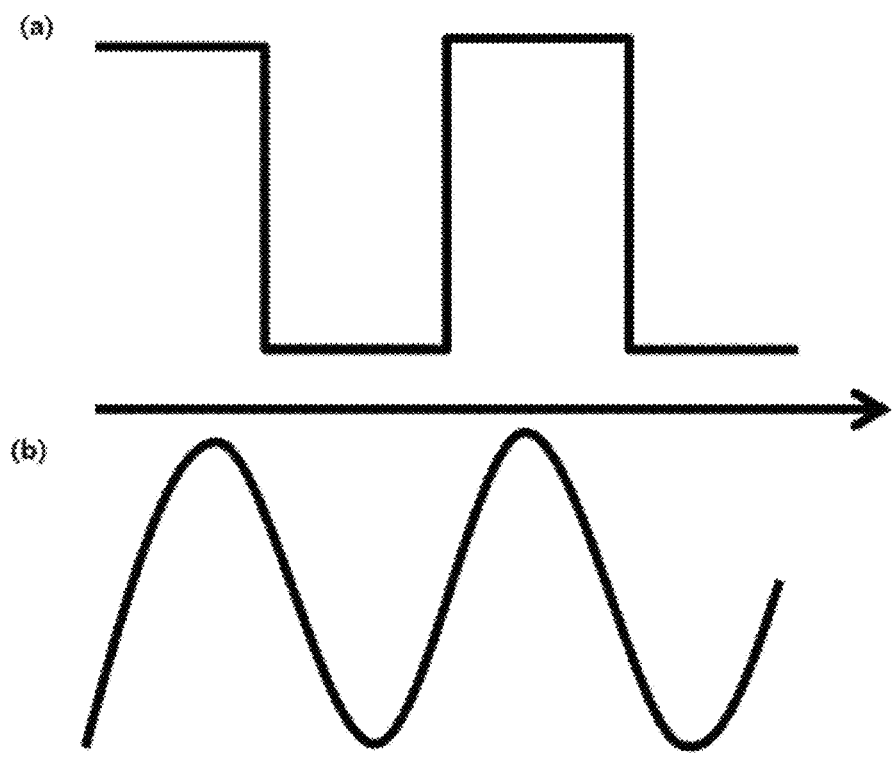

[Figure 5]
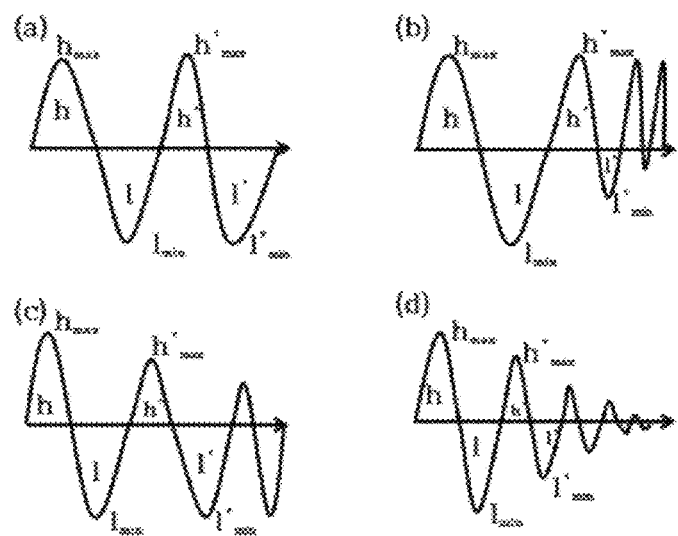
[Figure 6]
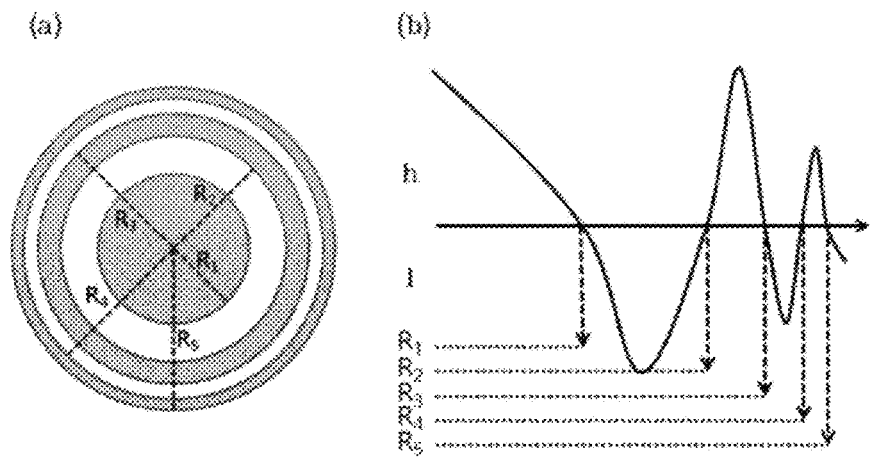

[Figure 7]
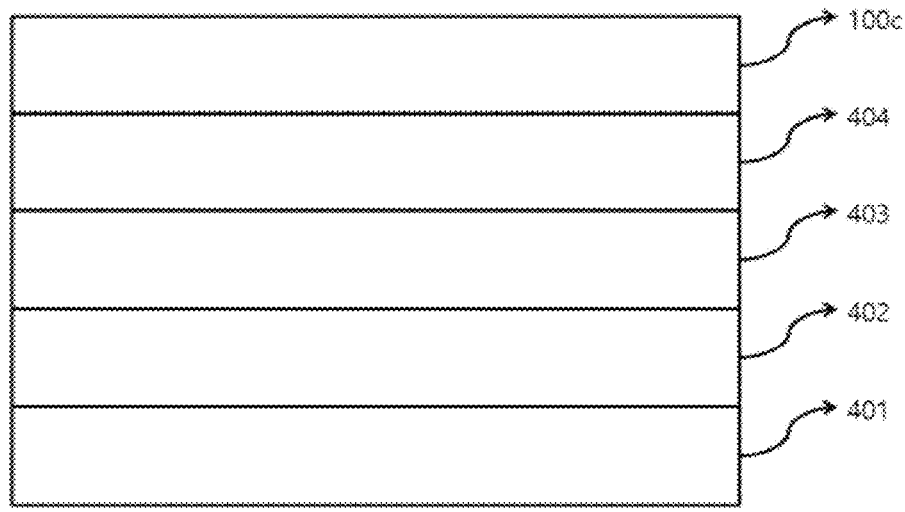
[Figure 8]
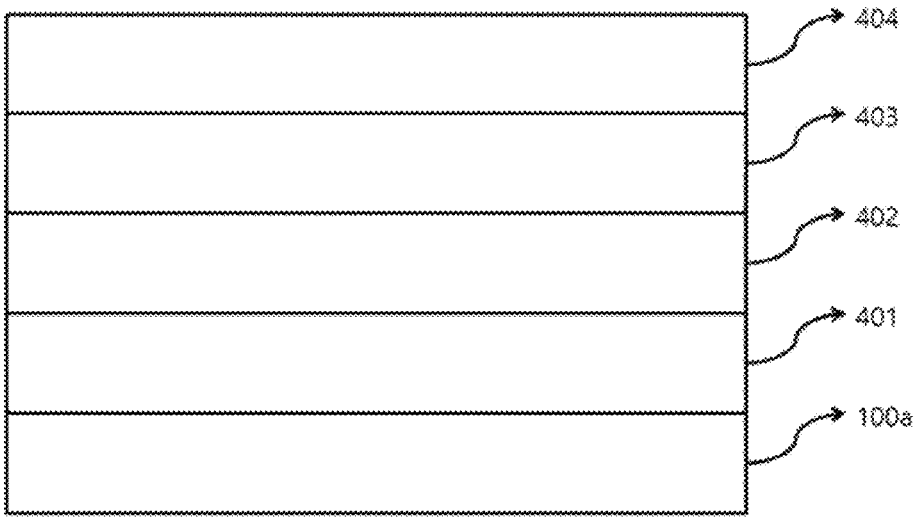

[Figure 9]
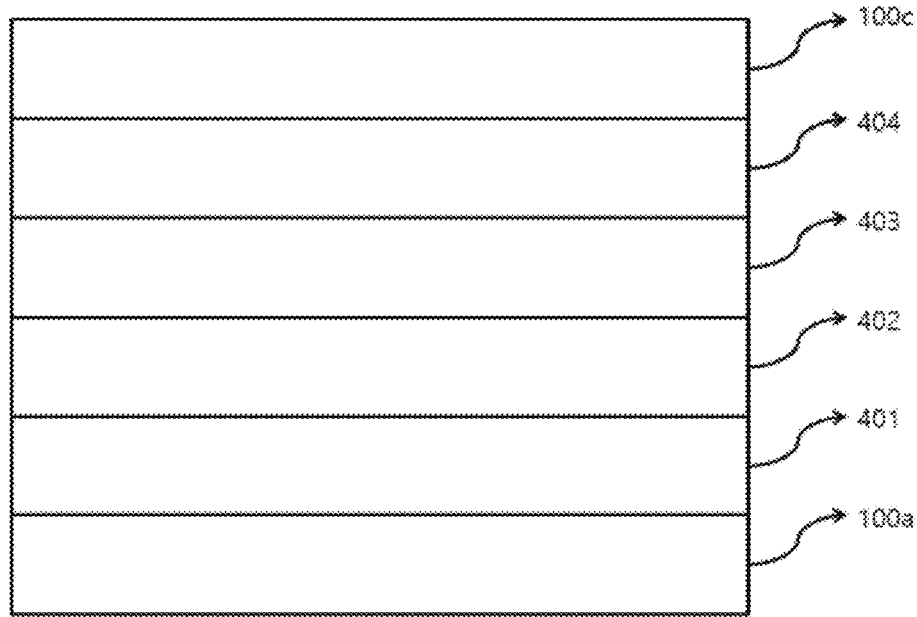
[Figure 10]
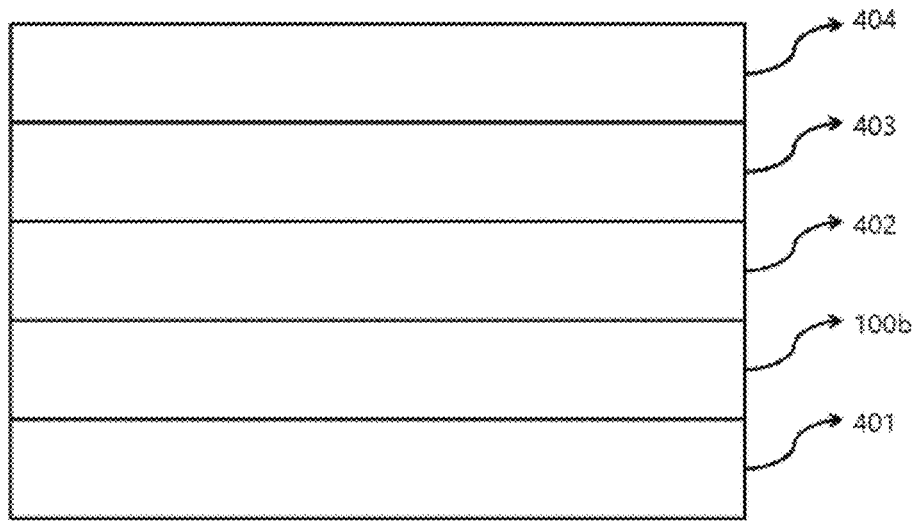

[Figure 11]
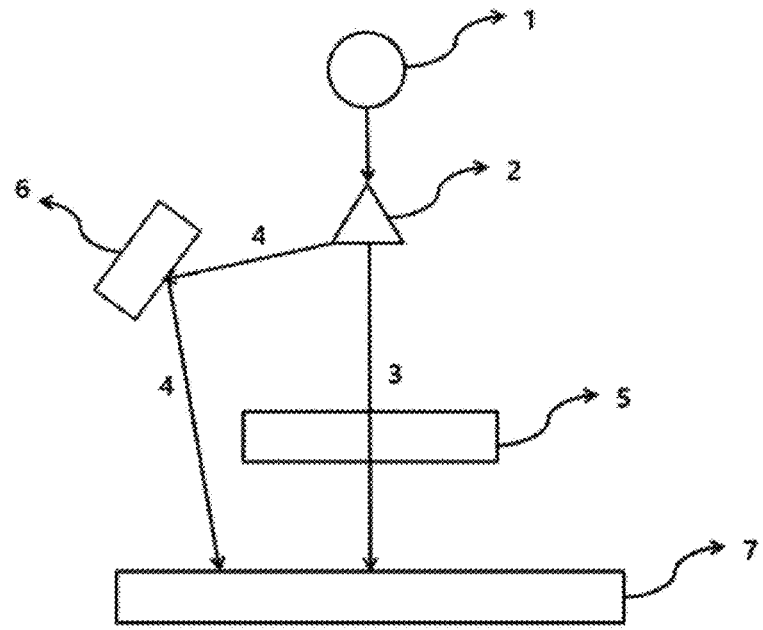
[Figure 12]
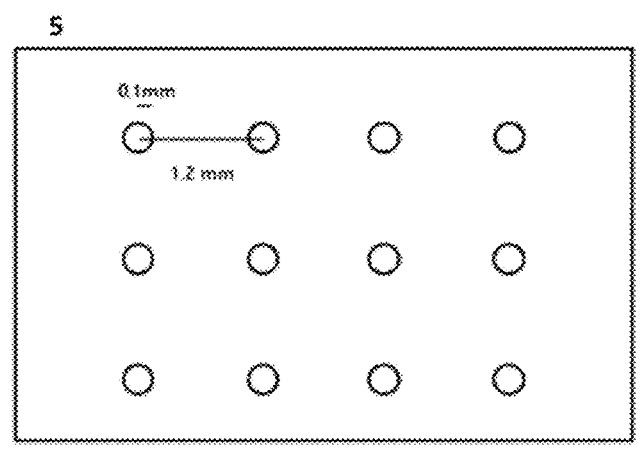

[Figure 13]
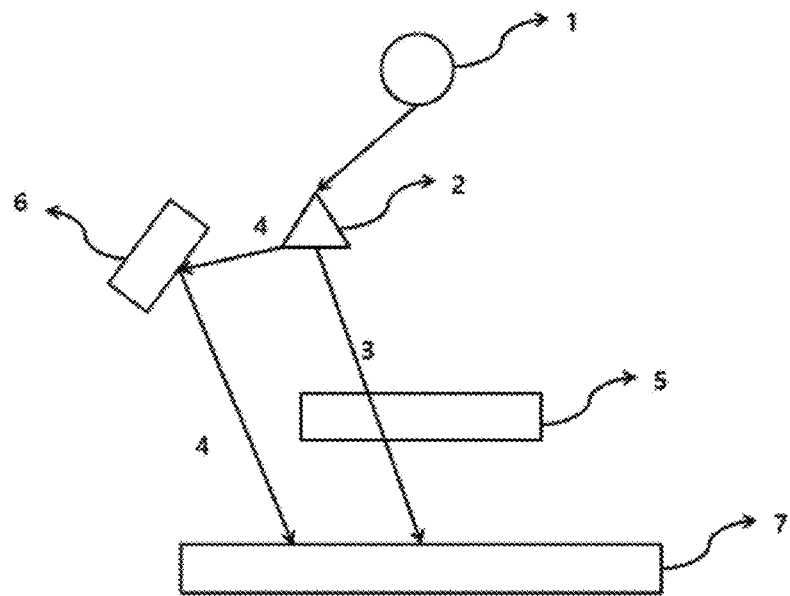
[Figure 14]
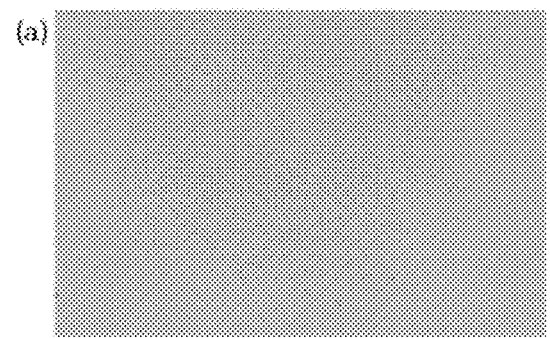
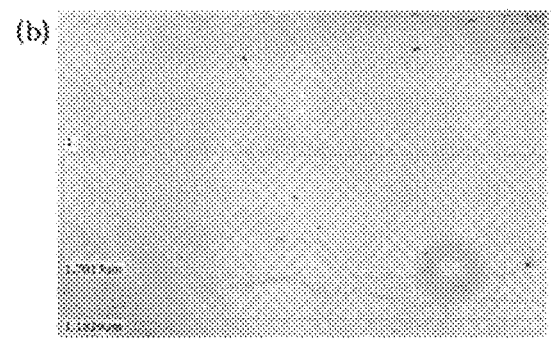

[Figure 15]
(a)
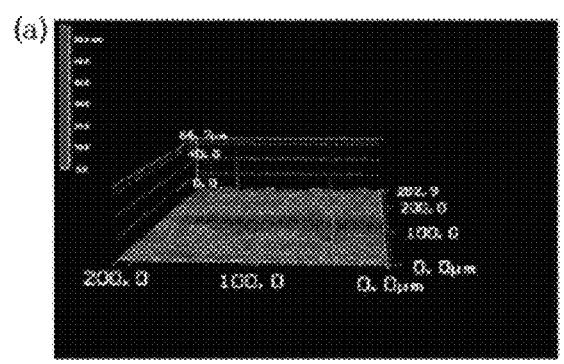
(b)
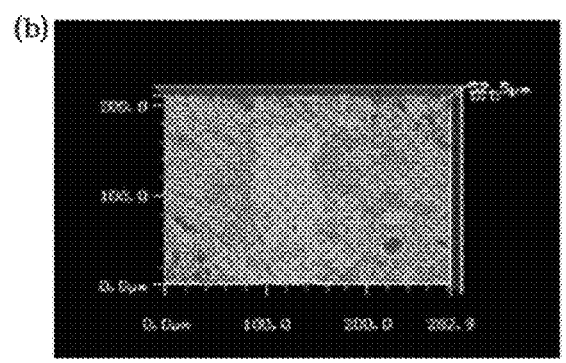

[Figure 16]
(a)
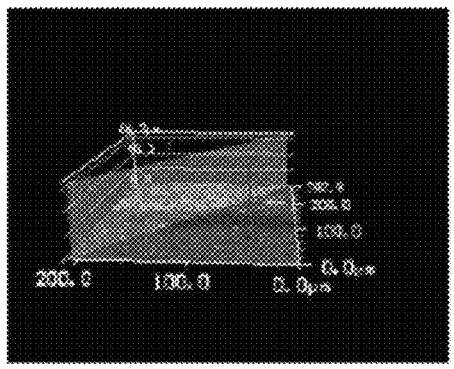
(b)
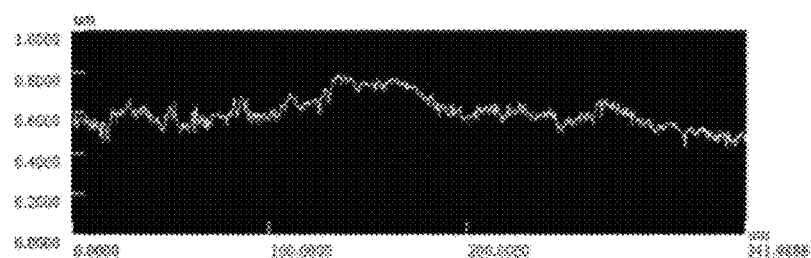
[Figure 17]
(a)
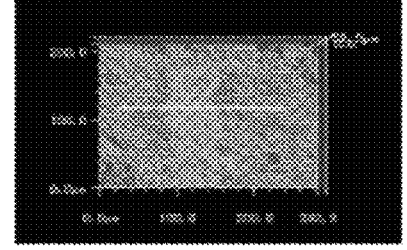
(b)
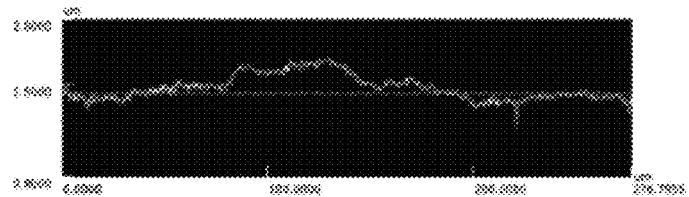

[Figure 18]
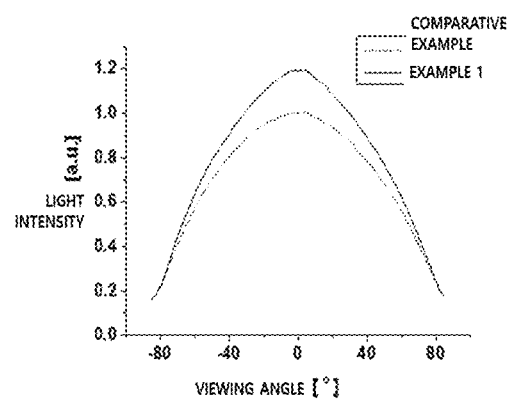
[Figure 19]
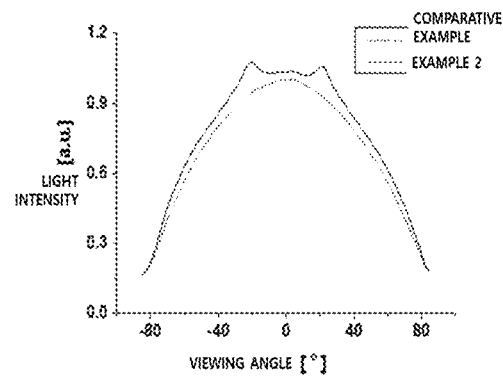

OPTICAL FILM

TECHNICAL FIELD

This application claims the benefit of the filing date of the Korean Patent Application No. 10-2018-0000786 filed on Jan. 3, 2018, the disclosure of which is incorporated herein by reference in its entirety.

The present application relates to an optical film and a use thereof.

BACKGROUND ART

Optical films can be used in various fields. The optical film can be used, for example, in an organic light emitting diode (OLED). The organic light emitting diode (OLED) is an element applied with a self-luminous organic substance when a current flows. The organic light emitting diode comprises, for example, a substrate, an organic light emitting layer laminated on the substrate, and electrodes existing on both sides of the organic light emitting layer. Holes and electrons supplied from the electrodes combine in the organic light emitting layer and generate light emitted to the outside.

Only the light passing through the interface formed by the respective elements constituting the organic light emitting diode among lights generated in the organic light emitting layer can be recognized from the outside. However, since the elements have different refractive indices, a part of light generated in the organic light emitting layer is subjected to a guided wave, or is totally reflected between the elements, and thus there is a problem that the light is not emitted to the outside. That is, in an OLED element having a usual laminated structure, only 20% or so of the light quantity of the light generated in the light emitting layer can be emitted to the outside of the OLED element to be visually recognized. Therefore, in order to secure brightness above a certain level, there is no other way than to increase the applied voltage. However, when the voltage applied to the OLED is increased, power consumption is inevitably large. Furthermore, when the voltage applied to the OLED increases, the organic light emitting layer is continuously exposed to a high voltage, so that deterioration of the organic material in the organic light emitting layer progresses, thereby shortening the lifetime of the element. In order to solve the above problems, there is a demand for a technology capable of effectively extracting light generated in the organic light emitting layer.

A technology applied to increase the efficiency of extracting light generated from the organic light emitting layer to the outside can be commonly called a light extraction technology. Light extraction technologies can be typically classified into an internal light extraction technology and an external light extraction technology. A part of the light generated in the organic light emitting layer is totally reflected from the surface of the substrate toward the organic light emitting layer due to a difference in refractive index between the electrode and the substrate, or is subjected to a guided wave inside the electrode and disappears. In order to extract this extinction light, there is a method of forming an irregular concave-convex structure on the surface of the substrate facing the electrode or giving a haze thereto, which is called internal light extraction. Then, the light transmitted through the electrode by the internal light extraction method to be incident on the substrate is totally reflected in the direction toward the electrode due to a difference in refractive index between the substrate and the atmosphere, or is subjected to a guided wave in the substrate and disappears. In order to extract this extinction light out of the substrate, a concavo-convex structure is formed on the surface of the substrate facing the air layer, or a haze is given thereto, which is called external light extraction.

In recent years, a method using a micro lens array (MLA) film has been applied to perform light extraction in a similar manner to the above-described concavo-convex structure. However, the concavo-convex structure or the MLA film as described above is not suitable for an environment with a high degree of abrasion because of the presence of a fine concavo-convex structure or physical bending on the surface of the substrate, and the like. In addition, when a high pressure is required in the OLED manufacturing process, for example, in the process of forming the concavo-convex structure or the MLA structure between the electrode and the substrate and applying the high pressure to the structure to bond the electrode and the substrate together, the above-described concavo-convex structure or MLA structure and the like may be damaged. Then, the light extracting or light directing degree of the above-described concavo-convex structure or MLA structure depends on a physical pattern formed thereon. Since the pattern has a very small size, it is difficult to finely control the shape of the pattern.

DISCLOSURE

Technical Problem

The present application relates to an optical film and a use thereof.

Technical Solution

In the present application, the reference wavelength of optical properties such as the refractive index can be determined depending on the wavelength of the light to be extracted or directed by using the optical film of the present application, unless otherwise specified. For example, the reference wavelength may be a wavelength of light to be extracted using the optical film. For example, when the optical film is used to extract light having a wavelength in the visible light region, the reference wavelength of the refractive index or the like may have a value based on light having any wavelength within a range of 400 nm to 700 nm, for example, a wavelength of about 550 nm or a wavelength of about 532 nm. In another example, when the optical film is used to extract light in the infrared region, the refractive index or the like may have a value based on light having any wavelength within a range of 700 nm to 1000 nm, for example, a wavelength of about 850 nm. In another example, when the optical film is used to extract light in the ultraviolet region, the refractive index or the like may have a value based on light having any wavelength within a range of 100 nm to 400 nm, for example, a wavelength of about 300 nm.

In the present application, the plane direction may mean a direction parallel to the plane having the maximum area in the optical film, for example, a direction parallel to the plane formed by the remaining two axes except for the shortest axis of the optical film. Specifically, when three axes formed by the optical film are represented by x-axis, y-axis and z-axis, and the relation of "length in the x-axis direction> length in the y-axis direction> length in the z-axis direction" or "length in the y-axis direction> length in the x-axis direction> length in the z-axis direction" in the optical film is established, the plane direction may mean a direction parallel to the plane formed by the x-axis and the y-axis of the optical film.

In the present application, the thickness direction may mean the normal direction of the plane having the maximum area of the optical film. That is, the thickness direction of the optical film may mean the direction of the plane direction normal, and in the above example, it may mean the z-axis direction.

The present application relates to an optical film. The optical film of the present application may be an optical film for light extraction or an optical film for light directing. Specifically, the optical film of the present application may mean an optical film that functions to extract light which is internally lost in an electronic device, for example, an organic light emitting element or the like, to the outside, so that it improves brightness at all viewing angles or a specific viewing angle of the element.

The optical film of the present application may comprise a refractive index changing unit region. Here, the refractive index changing unit region refers to a region where the refractive index varies repetitively. Furthermore, in the present application, the refractive index changing pattern can also be visualized through drawings to be described below. In the refractive index changing unit region, the refractive index may vary along the plane direction. The refractive index changing aspect in the refractive index changing unit region is not particularly limited. For example, the refractive index of the optical film may also vary in various aspects such as increasing, decreasing, or repeating with a certain period along the plane direction.

The refractive index changing unit region may comprise at least one high-refraction unit region and at least one low-refraction unit region. Here, on the basis of the average refractive index of the relevant optical film, the region having a refractive index higher than that may be a high-refraction unit region, and the region having a refractive index lower than that may be a low-refraction unit region. In addition, the high-refraction unit region and the low-refraction unit region may share the same center point to each other. That is, the figure formed by the high-refraction unit region and the figure formed by the low-refraction unit region may be a concentric figure.

Here, the average refractive index of the optical film may be an average of the maximum refractive index in the high-refraction unit region and the minimum refractive index in the low-refraction unit region. In addition, the average refractive index of the optical film may also be the average refractive index of the optical film before forming the refractive index changing unit region in the optical film, where the value may be the same as the average refractive index after the refractive index changing unit region is formed.

Here, the refractive index may mean a refractive index for a specific wavelength, for example, a wavelength of about 532 nm. Here, the refractive index may also be a value measured using a prism coupler. In addition, the refractive index may also mean a value calculated through the diffraction efficiency measured using a plurality of laser light sources (wavelengths of 632 nm and 532 nm) and a photo-diode detector.

In the refractive index changing unit region, the shape of the figure formed by the high-refraction unit region and/or the low-refraction unit region is not particularly limited. The shape of the figure may be, for example, a curved figure such as a circle or an ellipse; or a polygon such as a triangle, a rectangle, a pentagon or a hexagon, and the like. Here, when the shape of the relevant figure is an ellipse, its center point may be an intersection of the long axis and the short axis of the relevant ellipse. In addition, when the figure is a polygon, the center of one imaginary circle located inside the figure while contacting all the sides of the relevant polygon may be the center of the relevant refractive index changing unit region. Here, the circle, ellipse or polygon does not only mean a strictly mathematical circle, ellipse or polygon but also a shape which can be roughly recognized as a corresponding figure.

The high-refraction unit region and the low-refraction unit region existing in the refractive index changing unit region may alternately exist along a direction where is away from the center of the refractive index changing unit region along the plane direction. Specifically, the high-refraction unit region and the low-refraction unit region may also be alternately repeated and exist. That is, the refractive index of the optical film of the present application may also be changed in a form that high-refraction region and low-refraction region are alternately repeated along the plane direction.

FIG. 1 is a diagram showing an optical film (100) of the present application in the thickness direction, that is, the normal direction of the optical film, the enlarged diagram of the portion corresponding to the refractive index changing unit region (110) and a graph showing the refractive indexes according to plane direction positions of the optical film.

In the drawings of the present application, the refractive index changing unit region is exemplarily represented by a circle. Here, when the optical film (100) is observed in the thickness direction, a plurality of the refractive index changing unit regions (110) may also be observed. The refractive index changing unit region (110) may comprise at least one high-refraction unit region (112) and at least one low-refraction unit region (113), where the high-refraction unit region and the low-refraction unit region may be alternately repeated and exist in the refractive index changing unit region. In FIG. 1, the line (111) separating the high-refraction unit region and the low-refraction unit region of the refractive index changing unit region may also mean a region having the average refractive index of the maximum refractive index of the high-refraction unit region and the minimum refractive index of the low-refraction unit region. The line (111) may also be an interface between the high-refraction unit region and the low-refraction unit region. As shown in FIG. 1, while the high-refraction unit region exists in the central part of the refractive index changing unit region (110), the low-refraction unit region and the high-refraction unit region may also alternately repeated and exist along the direction away from the center. That is, any one of figures in one refractive index changing unit region (110) may be formed by the high-refraction unit region (112), and another figure adjacent to the figure may be formed by the low-refraction unit region (113). In this case, the boundary (111) between any one figure and another figure adjacent thereto may mean a boundary between the high-refraction unit region and the low-refraction unit region, that is, a region corresponding to the average refractive index of the optical film.

When an optical film whose refractive index changes according to the above-described shape is applied to an organic light emitting element, the light generated from the organic light emitting layer of the relevant element can be more effectively emitted to the outside of the element. For example, when the above-described optical film is applied to an organic light emitting element, the optical film may function as a light extracting film that the brightness of the element is improved for all viewing angles, or a light directing film that the brightness of the element is improved for a specific viewing angle.

In one example, the refractive index can continuously change in the refractive index changing unit region. Specifically, the refractive index change in the refractive index changing unit region may be continuous along the plane direction of the optical film. The point that the change of the refractive index is continuous will be described in more detail with reference to FIG. 4. FIG. 4 schematically represents the refractive index change observed when the optical film of the present application has been observed in the plane direction. Specifically, FIG. 4(a) simply shows a case where the refractive index change is discontinuous, and FIG. 4(b) shows a case where the refractive index change is continuous. FIG. 4 is continuously shown only in order to explain that the refractive index changing aspect of the present application is continuous, where the refractive index changing aspect of the present application does not always coincide with that shown in FIG. 4.

In one example, the refractive index of the refractive index changing unit region in the optical film can be determined in consideration of specifications of the organic electronic device to which the optical film is to be applied. For example, the maximum refractive index of the high-refraction unit region may be, for example, in a range of 1.3 to 1.7. The maximum refractive index may be 1.31 or more, 1.32 or more, 1.33 or more, 1.34 or more, 1.35 or more, 1.36 or more, 1.37 or more, 1.38 or more, 1.39 or more, or 1.40 or more, and may be 1.7 or less, 1.69 or less, 1.68 or less, 1.67 or less, 1.66 or less, 1.65 or less, 1.64 or less, 1.63 or less, 1.62 or less, 1.61 or less, or 1.60 or less. Furthermore, the minimum refractive index of the low-refraction unit region may be, for example, in a range of 1.2 to 1.6. The minimum refractive index may be 1.2 or more, 1.21 or more, 1.22 or more, 1.23 or more, 1.24 or more, 1.25 or more, 1.26 or more, 1.27 or more, 1.28 or more, 1.29 or more, or 1.30 or more, and may be 1.6 or less, 1.59 or less, 1.58 or less, 1.57 or less, 1.56 or less, 1.55 or less, 1.54 or less, 1.53 or less, 1.52 or less, 1.51 or less, 1.50 or less, or 1.48 or less. The maximum refractive index in the high-refraction unit region and the minimum refractive index in the low-refraction region can be adjusted, for example, according to the power of the laser irradiated when the optical film is produced and/or the time that the laser is irradiated. For example, the region irradiated with the laser used upon manufacturing the optical film may be the center of the refractive index changing unit region, where as the power of the laser increases, the maximum refractive index in the high-refraction unit region may increase and the minimum refractive index in the low-refraction unit region may decrease. Also, as the irradiation time of the relevant laser increases, the maximum refractive index in the high-refraction unit region may increase and then decrease after a predetermined time has elapsed, and the minimum refractive index in the low-refraction region may decrease and then increase after a predetermined time has elapsed.

In one example, the average refractive index of the optical film may also be determined in consideration of the thickness of the film and/or the specifications of the organic electronic device to which the optical film is to be applied. The average refractive index may be, for example, in a range of 1.3 to 1.8. In another example, the refractive index may be 1.35 or more, 1.4 or more, 1.45 or more, or 1.5 or more, and may be 1.75 or less, 1.7 or less, 1.65 or less, 1.6 or less, or 1.55 or less.

In one example, the refractive index changing unit region may comprise a plurality of high-refraction unit regions and a plurality of low-refraction unit regions. At this time, the maximum refractive index of any one high-refraction unit region and the maximum refractive index of another high-refraction unit region may also be the same or different from each other. Specifically, when the high-refraction unit region and the low-refraction unit region are alternately present in the refractive index changing unit region, the maximum refractive index in any one high-refraction unit region and the maximum refractive index in another high-refraction unit region adjacent to the high-refraction region may also be the same or different from each other.

In another example, the minimum refractive index of any one low-refraction unit region and the minimum refractive index of another low-refraction unit region may also be the same or different from each other. Specifically, when the high-refraction unit region and the low-refraction unit region are alternately present in the refractive index changing unit region, the minimum refractive index in any one low-refraction unit region and the minimum refractive index in another low-refraction region adjacent to the low-refraction unit region may be the same or different from each other.

An aspect of the refractive index change in the optical film of the present application has been illustrated in FIG. 5.

As in FIG. 5(a), the maximum refractive index ($h_{max}$) of any one high-refraction unit region (h) in the refractive index changing unit region, and the maximum refractive index ($h_{max}'$) of the high-refraction unit region (h') adjacent to the corresponding high-refraction unit region may be the same, and simultaneously the minimum refractive index ($l_{min}$) of any one low-refraction unit region (l) and the minimum refractive index ($l_{min}'$) of the low-refraction unit region (l') adjacent to the corresponding low-refraction unit region may also be the same.

In another example, as in FIG. 5(b), the maximum refractive index ($h_{max}$) of any one high-refraction unit region (h) in the refractive index changing unit region, and the maximum refractive index ($h'_{max}$) of the high-refraction unit region (h') adjacent to the corresponding high-refraction unit region may be the same, but the minimum refractive indexes ($l_{min}$, $l'_{min}$) of the low-refraction unit regions (l, l') may also increase in the direction away from the center of the refractive index changing unit region along the plane direction.

In another example, as in FIG. 5(c), the minimum refractive index ($l_{min}$) of any one low-refraction unit region (l) in the refractive index changing unit region and the minimum refractive index ($l'_{min}$) of the low-refraction unit region (l') adjacent to the corresponding low-refraction unit region may be the same, but the maximum refractive indexes ($h_{max}$, $h'_{max}$) of the high-refraction unit regions (h, h') may also decrease in the direction away from the center of the refractive index changing unit region along the plane direction.

In another example, as in FIG. 5(d), the maximum refractive indexes ($h_{max}$, $h'_{max}$) of the high-refraction unit regions (h, h') in the refractive index changing unit region may decrease in the direction away from the center of the refractive index changing unit region along the plane direction, and the minimum refractive indexes ($l_{min}$, $l'_{min}$) of the low-refraction unit regions (l, l') may also increase in the direction away from the center of the refractive index changing unit region along the plane direction.

In one example, the diameters of the figures formed by the high-refraction unit region and the low-refraction unit region, respectively, in the refractive index changing unit region may be different from each other. At this time, when the figure is a circle, the diameter of the figure may mean the diameter of the relevant circle; when the figure is an ellipse, it may mean the length of the major axis of the ellipse; and when the figure is a polygon, it may mean the diameter of the circle formed by the center of the relevant polygon as described above. At this time, the difference in radii between the figures adjacent to each other may also decrease along the direction away from the center of the refractive index changing unit region. Then, when the difference in radii between the figures adjacent to each other decreases along the direction away from the center of the refractive index changing unit region, a plurality of refractive index changing unit regions may exist in the optical film.

FIG. 6 shows a schematic diagram of a refractive index changing unit region observed when the optical film of the present application has been viewed in the thickness direction, and a refractive index change in the refractive index changing unit region observed when it has been viewed in the plane direction. In FIG. 6(a), the shaded portion represents the high-refraction unit region, and the un-shaded portion represents the low-refraction unit region. In FIG. 6(b), the upper region of the solid line arrow means the high-refraction unit region (h), the lower region means the low-refraction unit region (l), and the solid line arrow portion means the region having the average refractive index of the relevant optical film. As shown in FIG. 6, when a high-refraction unit region and a low-refraction unit region are alternately present along the plane direction in the refractive index changing unit region and the relevant high-refraction unit region or low-refraction unit region forms a concentric figure, the distance from the center of the relevant refractive index changing unit region to the interface between the relevant high-refraction unit region and low-refraction unit region may mean the radius of the corresponding concentric figure. Referring to FIG. 6, in the refractive index changing unit region, the relevant concentric figures may be formed so that the differences ($R_2-R_1$, $R_3-R_2$, $R_4-R_3$, etc.) in radii between concentric figures adjacent to each other decrease along the direction away from the center of the refractive index changing unit region. Here, in the refractive index changing unit region, the distance between the relevant concentric figures may vary depending on the wavelength of the laser irradiated when the optical film of the present application is manufactured, the angle that the recording light and the reference light formed by dividing the relevant laser form with the normal line of the relevant optical film and/or the spacing between the mask and the photosensitive material applied in the relevant process.

For example, as the wavelength of the relevant laser increases, the distance between the relevant concentric figures may increase. Also, as the angle that the recording light and the reference light form with the normal line of the relevant optical film increases, the distance between the relevant concentric figures may decrease. Then, as the spacing between the mask and the photosensitive material increases, the distance between the relevant concentric figures increases.

The refractive index changing unit region is designed so that the difference in radii between concentric figures adjacent to each other decreases along the direction away from the center of the refractive index changing unit region as above, whereby the light extraction efficiency of the optical film of the present application can be further improved.

As described above, in the case where the length of the radius between concentric figures adjacent to each other decreases along the direction away from the center of the refractive index changing unit region, a plurality of refractive index changing unit regions may exist in the optical film. At this time, when a plurality of concentric figures exist in any one of the refractive index changing unit regions and the difference in radius between concentric figures adjacent to each other decreases along the direction away from the center of the concentric figure unit and then begins to increase again along the relevant direction, the point at which the radial difference between the concentric figures begins to increase can be a boundary that distinguishes any one refractive index changing unit region from another refractive index changing unit region.

In another example, the radius of the refractive index changing unit region may be, for example, in a range of 0.2 mm to 6 mm. When the plurality of refractive index changing unit region exist in the optical film, the radius may mean a distance from the center of the refractive index changing unit region to the above-described boundary that distinguishes the refractive index changing unit regions. The radius may be determined according to the size of the perforations in the mask used upon producing the optical film, or the like. For example, the radius may be determined according to the size of the perforations in the mask used upon manufacturing the optical film. In another example, the radius may be 0.25 mm or more, 0.3 mm or more, 0.35 mm or more, 0.4 mm or more, 0.45 mm or more, 0.5 mm or more, or 0.55 mm or more, and may be 5 mm or less, 4 mm or less, 3 mm or less, 2 mm or less, 01 mm or less, 0.9 mm or less, 0.8 mm or less, 0.7 mm or less, or 0.65 mm or less.

Furthermore, the interval (pitch) of the plurality of refractive index changing unit regions may be, for example, in a range of 0.2 mm to 12 mm. The interval may mean, for example, a straight line distance from the center of any one refractive index changing unit region to the center of another refractive index changing unit region adjacent to the region. The interval may also be determined according to the thickness of the optical film itself, the wavelength of the light to be extracted from the optical element, and/or the spacing between the perforations in the mask used upon producing the optical film, and the like. For example, the spacing between the concentric figures may be determined according to the spacing between the perforations in the mask used upon producing the optical film. In another example, the spacing may be about 0.40 mm or more, or about 0.80 mm or more, and may be about 12 mm or less, about 11.8 mm or less, about 11.6 mm or less, about 11.4 mm or less, about 11.2 mm or less, or about 11.0 mm or less, but is not limited thereto.

In the optical film of the present application, the aspect of the arrangement of the refractive index changing unit regions may vary depending on the application to which the relevant optical film is applied or the angle that the light extracted from an organic light emitting element is directed when the relevant optical film has been applied to the element, and the like. In one example, the plurality of refractive index changing unit regions may be regularly arranged with respect to each other. Here, the fact that the refractive index changing unit regions are arranged regularly may mean that when the center point of any one refractive index changing unit region has been connected to the center point of another refractive index changing unit region, a certain length of line segment is formed, that is, that the plurality of refractive index changing unit regions are arranged according to a predetermined rule.

For example, if three or more refractive index changing unit regions exist in the optical film and the corresponding regions are regularly arranged, a polygon may also be formed when connecting the center points of the respective refractive index changing unit regions adjacent to any one refractive index changing unit region. When the centers of the refractive index changing unit regions adjacent to any one refractive index changing unit region have been connected, FIG. 2 is a diagram showing a form that the shape is a rectangle. When the centers of the refractive index changing unit regions adjacent to any one refractive index changing unit region have been connected, FIG. 3 is a diagram showing a form that the shape is a hexagon. By comprising the refractive index changing unit regions arranged in the above-described shape, the optical film of the present application can more effectively extract the light generated in a light emitting layer of an organic light emitting element to the outside, when it has been applied to the element or the like.

In one example, in order that no pore exists in an element to which the optical film of the present application is applied or that the relevant optical film is not damaged when an element is manufactured through high pressure treatment or the like, the optical film may be designed so as to have a flat structure. For example, in the optical film of the present application, physical unevenness may not exist inside and/or outside. Here, the existence of physical unevenness inside the optical film may mean that a structure embedded in the optical film (internal light extracting structure) exists. In addition, the existence of physical unevenness outside the optical film may mean that a structure protruding out of the optical film (external light extracting structure, for example, micro lens array (MLA), etc.) exists. By designing the optical film of the present application so as not to have physical unevenness inside and/or outside, the optical film can exhibit strong abrasion resistance as compared to the external light extracting structure, and the optical film can also be applied to a high-pressure process or the like which is difficult to apply the internal light extracting structure.

When there is substantially no physical unevenness inside and/or outside as above, the surface roughness of the optical film of the present application may be less than about 1 µm, and in another example, it may also be less than about 0.1 µm, less than 0.09 µm, or less than 0.08 µm. In addition, the surface roughness is a value measured by a known average surface roughness measuring method, which may be, for example, a value measured using a Multimode AFM instrument from Bruker or a VK-X200 shape analyzer from Keyence.

The thickness of the optical film is not particularly limited, which may be determined in consideration of specifications of an organic light emitting element to which the optical film is applied. The thickness of the optical film may be, for example, in a range of 3 µm to 300 µm. The thickness of the optical film may be 3 µm or more, 6 µm or more, 10 µm or more, or 20 µm or more, and may also be 300 µm or less, 150 µm or less, 90 µm or less, or 45 µm or less. The thickness of the optical film may be measured by SBW-331ML/d from Kobelco Research Institute, Inc., which is Bow/Warp measuring equipment.

In one example, the optical film of the present application may be a holographic optical element in which a refractive index changing pattern is recorded. Here, the holography is commonly called a technique of forming an interference pattern on a photosensitive material to reproduce a three-dimensional image called a hologram. In addition, the holographic optical element (HOE) may mean an optical element formed of a photosensitive material having an interference pattern as above. Specifically, the holographic element may mean an element in which a film comprising a photosensitive material is irradiated with recording light to record an interference pattern on the film. Here, the interference pattern may serve as a diffraction grating for diffracting reproduction light irradiated to the holographic element, and the relevant interference pattern may represent a periodically repeated form.

The holographic element may comprise a photosensitive material as a recording medium. As long as the photosensitive material is a material capable of recording an interference pattern due to a difference in refractive index by aggregating high refractive index components themselves and aggregating low refractive index components themselves among components in the relevant material according to irradiation of object light, the kind thereof is not particularly limited. As the photosensitive material, for example, a material such as a photopolymer, a photoresist, a silver halide emulsion, a dichromated gelatin, a photographic emulsion, a photothermoplastic or a photorefractive material may be used.

The holographic optical element may also be, for example, in a film form consisting of only a photosensitive material (e.g., a photopolymer), or may be in a film form having a layered structure such as a form laminating a base material and a photopolymer.

The holographic optical element may have array shapes and/or pitches of a structure which is difficult to be realized in the micro lens array (MLA) film or the concavo-convex structure. In addition, the holographic optical element is not limited in structures, shapes, light directing directions, etc., as compared to a light extracting element with a micro lens array (MLA) or a concavo-convex structure, and particularly, can freely control light characteristics such as wavelengths or incident angles and/or output angles. By applying the holographic optical element, the light extraction with excellent efficiency can be allowed and simultaneously the characteristics of light extracted according to desired light characteristics can be freely controlled.

As the optical film of the present application, a comparatively flat holographic optical element in which a refractive index variation pattern as described above exists and a bending and fine concavo-convex structure is not formed on the surface can be applied to a device requiring abrasion resistance and the like. In addition, in the case of using the holographic optical element, unlike a conventional light extracting film, which is destroyed when a high pressure is applied in the process of manufacturing an organic light emitting element or the like, it is not destroyed in the high-pressure process and simultaneously the light extraction property may be not degraded.

The method for producing an optical film of the present application is not particularly limited as long as it is a method capable of forming the above-described refractive index changing unit region. For example, the optical film may be produced using a method of irradiating the above-described photosensitive material with light, but by a method of controlling an angle of the relevant light. In addition, the optical film may also be produced by a method of placing a mask capable of forming a refractive index changing unit region on the above-described photosensitive material, and then irradiating it with light. As an example of the method of controlling an angle of light, a method of continuously changing a plurality of light angles may also be used. Furthermore, as an example of the method of using a mask, a method of placing a mask having a plurality of perforations, and then forming a refractive index changing unit region while causing diffraction and interference of irradiation light may be used.

The type of the holographic optical element is not particularly limited, and a holographic optical element capable of imparting light extraction or light directing function to the relevant organic light emitting element may be used. For example, the holographic optical element may be a transmissive holographic optical element. Here, the transmissive holographic optical element may mean an optical element that transmits light incident at a predetermined incident angle. In the case where the transmissive holographic optical element is applied to an organic light emitting element as the optical film of the present application, by adjusting the output angle or the like of light generated in the organic light emitting layer, it can function to prevent the light from being totally reflected at the interface between the transparent electrode and the substrate or the interface between the substrate and the air layer.

Here, it can be determined whether or not any holographic optical element is a transmissive holographic optical element, upon manufacturing the holographic optical element by exposing a photosensitive material having the same composition to a laser, according to the irradiation method of the relevant laser. Specifically, in the process of exposing any photosensitive material to a laser to form an interference pattern and manufacturing a holographic optical element, it can be determined whether or not the corresponding element is a transmissive type according to the direction where object light and reference light are incident. For example, when both the object light and the reference light to be irradiated at the time of manufacturing the holographic optical element are irradiated on the same surface of the photosensitive material, a transmissive holographic element can be manufactured. Here, the object light means recording light that is irregularly reflected from the object surface to reach the photosensitive material when the holographic optical element is manufactured, and the reference light means recording light that reaches the photosensitive material directly without passing through the object.

The optical film of the present application may further comprise a base layer. As the base layer, for example, an inorganic film such as glass, a crystalline or amorphous silicon film, quartz or an ITO (indium tin oxide) film, or a plastic film can be used. As the plastic film, a film comprising TAC (triacetyl cellulose); a COP (cyclo olefin copolymer) such as a norbornene derivative; PMMA (poly(methyl methacrylate); PC (polycarbonate); PE (polyethylene); PP (polypropylene); PVA (polyvinyl alcohol); DAC (diacetyl cellulose); Pac (polyacrylate); PES (poly ether sulfone); PEEK (polyetheretherketon); PPS (polyphenylsulfone), PEI (polyetherimide); PEN (polyethylenemaphthatlate); PET (polyethyleneterephtalate); PI (polyimide); PSF (polysulfone); PAR (polyarylate) or an amorphous fluororesin, and the like can be used, without being limited thereto.

The present application also relates to a use of the optical film. The present application relates to, for example, an organic light emitting element comprising the optical film. The organic light emitting element may comprise the optical film and an organic light emitting panel. The organic light emitting panel may comprise, for example, a substrate; and a transparent electrode layer; an organic light emitting layer; and a reflective electrode layer, sequentially provided on one side of the substrate. Also, in the organic light emitting element, the optical film may be located on at least one of a surface between the substrate and the transparent electrode layer (an interface between the substrate and the transparent electrode layer) and an opposite surface of the transparent electrode layer based on the substrate. That is, the optical film may be located on the surface between the substrate and the transparent electrode layer, or on the opposite side surface of the transparent electrode layer based on the substrate, and may also be located on both of the surfaces.

As the substrate, a glass substrate or a plastic substrate can be used. As the glass substrate, for example, a substrate comprising soda lime glass, barium/strontium-containing glass, lead glass, aluminosilicate glass, borosilicate glass, barium borosilicate glass or quartz can be used. As the plastic substrate, a substrate comprising TAC (triacetyl cellulose); a COP (cyclo olefin copolymer) such as a norbomene derivative; PMMA (poly(methyl methacrylate); PC (polycarbonate); PE (polyethylene); PP (polypropylene); PVA (polyvinyl alcohol); DAC (diacetyl cellulose); Pac (polyacrylate); PES (poly ether sulfone); PEEK (polyetheretherketon); PPS (polyphenylsulfone), PEI (polyetherimide); PEN (polyethylenemaphthatlate); PET (polyethyleneterephtalate); PI (polyimide); PSF (polysulfone); PAR (polyarylate) or an amorphous fluororesin, and the like can be used. The substrate may be, for example, a transparent substrate. Furthermore, in the case where the organic light emitting element is a top light emitting type element, that is, an element in which the light generated in the organic light emitting layer is extracted from the reflective electrode layer side, the substrate may also be opaque.

The organic light emitting element may be a bottom light emitting type element. For example, the organic light emitting element may be an element in which the light generated in the organic light emitting layer is reflected from the reflective electrode layer and transmitted through the transparent electrode layer, thereby being extracted to the transparent electrode layer side.

The transparent electrode layer may be an anode and the reflective electrode layer may be a cathode. The anode is an electrode into which holes are injected, which can be made of a conductive material having a high work function. The cathode is an electrode into which electrons are injected, which can be made of a conductive material having a low work function. The anode may comprise a transparent metal oxide, for example, ITO (indium tin oxide), IZO (indium zinc oxide), AZO (aluminum-doped zinc oxide), GZO (gallium-doped zinc oxide), ATO (antimony tin oxide) or $SnO_2$, and the like. The cathode may comprise a metal, for example, Ag, Au or Al, and the like.

The organic light emitting layer may comprise an organic material capable of generating light when power has been applied to the transparent electrode layer and the reflective electrode layer. Light can be generated by recombining electrons and holes injected from the transparent electrode layer and the reflective electrode layer in the organic light emitting layer.

The organic light emitting layer may comprise a red light emitting layer, a green light emitting layer and a blue light emitting layer. The light emitting layer may comprise known organic materials capable of emitting red, green and blue light, respectively. The organic light emitting element may also be driven by a method (RGB method) in which the light emitting layers of three primary colors emit different colors, respectively, to form one pixel (picture element, point). In addition, the organic light emitting element may also be driven by a method (white OLED method) in which one pixel is constructed by laminating the light emitting layers of three primary colors and constituting them so as to emit white, and then various colors are implemented by disposing a color filter layer on the top of the white light emitting layer.

The organic light emitting panel may further comprise a sub-layer between the transparent electrode layer and the organic light emitting layer and/or between the reflective electrode layer and the organic light emitting layer. The sub-layer may also comprise a hole transporting layer, a hole injecting layer, an electron injecting layer and an electron transporting layer for controlling the balance of electrons and holes.

The electron injection layer or the electron transporting layer can be formed using, for example, an electron accepting organic compound. Here, as the electron accepting organic compound, any known compound can be used without any particular limitation. Such an organic compound can be exemplified by a polycyclic compound or derivatives thereof such as p-terphenyl or quaterphenyl, a polycyclic hydrocarbon compound or derivatives thereof such as naphthalene, tetracene, pyrene, coronene, chrysene, anthracene, diphenylanthracene, naphthacene or phenanthrene, or a heterocyclic compound or derivatives thereof such as phenanthroline, bathophenanthroline, phenanthridine, acridine, quinoline, quinoxaline or phenazine, and the like. Also, fluoroceine, perylene, phthaloperylene, naphthaloperylene, perynone, phthaloferrinone, naphthaloperynone, diphenylbutadiene, tetraphenylbutadiene, oxadiazole, aldazine, bisbenzoxazoline, bisstyryl, pyrazine, cyclopentadiene, oxine, aminoquinoline, imine, diphenylethylene, vinylanthracene, diaminocarbazole, pyrane, thiopyrane, polymethine, merocyanine, quinacridone or rubrene and the like, or derivatives thereof, a metal chelate complex compound, for example, a metal complex having as a ligand at least one of 8-quinolinolato or derivatives thereof, such as tris(8-quinolinolato)aluminum, bis(8-quinolinolato)magnesium, bis[benzo(f)-8-quinolinolato] zinc, bis(2-methyl-8-quinolinolato)aluminum, tris(8-quinolinolato)indium, tris(5-methyl-8-quinolinolato)aluminum, 8-quinolinolatolithium, tris(5-chloro-8-quinolinolato) gallium and bis(5-chloro-8-quinolinolato)calcium, which is a metal chelated oxanoid compound, an oxadiazole compound, a triazine compound, a stilbene derivative, or a distyrylarylene derivative, a styryl derivative, a diolefin derivative; a fluorescent brightening agent such as a benzoxazole compound, a benzothiazole compound or a benzoimidazole compound; a distyrylbenzene compound such as 1,4-bis(2-methylstyryl)benzene, 1,4-bis(3-methylstyryl) benzene, 1,4-bis(4-methylstyryl)benzene, distyrylbenzene, 1,4-bis(2-ethylstyryl)benzene, 1,4-bis(3-ethylstyryl)benzene, 1,4-bis(2-methylstyryl)-2-methylbenzene or 1,4-bis(2-methylstyryl)-2-ethylbenzene; a distyrylpyrazine compound such as 2,5-bis(4-methylstyryl)pyrazine, 2,5-bis(4-ethylstyryl)pyrazine, 2,5-bis[2-(1-naphthyl)vinyl]pyrazine, 2,5-bis(4-methoxystyryl)pyrazine, 2,5-bis[2-(4-biphenyl)vinyl] pyrazine or 2,5-bis[2-(1-pyrenyl)vinyl]pyrazine, a dimethylidine compound or derivatives thereof such as 1,4-phenylenedimethylidine, 4,4'-phenylenedimethylidine, 2,5-xylenedimethylidine, 2,6-naphthylenedimethylidine, 1,4-biphenylenedimethylidine, 1,4-para-terephthalyldimethylidine, 9,10-anthracenediyldimethylidine or 4,4'-(2,2-di-t-butylphenylvinyl)biphenyl or 4,4-(2,2-diphenylvinyl)biphenyl, a silanamine derivative, a multifunctional styryl compound, an oxadiazole derivative, an anthracene compound, an oxynate derivative, a tetraphenylbutadiene compound, an organic trifunctional compound, a coumarin derivative, a perylene derivative, a naphthalene derivative, a phthaloperynone derivative or a styrylamine derivative, and the like can be used as the electron accepting organic compound contained in the low-refraction layer. In addition, the electron injecting layer can also be formed using, for example, a material such as LiF or CsF.

The hole injecting layer or the hole transporting layer may comprise, for example, an electron donating organic compound. The electron donating organic compound can be typically exemplified by an arylamine compound such as N,N',N'-tetraphenyl-4,4'-diaminophenyl, N,N'-diphenyl-N, N'-di(3-methylphenyl)-4,4'-diaminobiphenyl, 2,2-bis(4-di-p-tolylaminophenyl)propane, N,N,N',N'-tetra-p-tolyl-4,4'-diaminobiphenyl, bis(4-di-p-tolylaminophenyl) phenylmethane, N,N'-diphenyl-N,N'-di(4-methoxyphenyl)-4,4'-diaminobiphenyl, N,N,N',N'-tetraphenyl-4,4'-diaminodiphenylether, 4,4'-bis(diphenylamino) quadriphenyl, 4-N,N-diphenylamino-(2-diphenylvinyl) benzene, 3-methoxy-4'-N,N-diphenylaminostilbenzene, N-phenylcarbazole, 1,1-bis(4-di-p-triaminophenyl)cyclohexane, 1,1-bis(4-di-p-triaminophenyl)-4-phenylcyclo hexane, bis(4-dimethylamino-2-methylphenyl)phenylmethane, N,N,N-tri(p-tolyl)amine, 4-(di-p-tolylamino)-4'-[4-(di-p-tolylamin)styryl]stilbene, N,N,N',N'-tetraphenyl-4,4'-diaminobiphenyl N-phenylcarbazole, 4,4'-bis[N-(1-naphthyl)-N-phenyl-amino]biphenyl, 4,4'-bis[N-(1-naphthyl)-N-phenylamino]p-terphenyl, 4,4'-bis[N-(2-naphthyl)-N-phenylamino]biphenyl, 4,4'-bis[N-(3-acenaphthenyl)-N-phenyl amino]biphenyl, 1,5-bis[N-(1-naphthyl)-N-phenyl amino]naphthalene, 4,4'-bis[N-(9-anthryl)-N-phenylamino] biphenylphenylamino]biphenyl, 4,4'-bis[N-(1-anthryl)-N-phenylamino]-p-terphenyl, 4,4-bis[N-(2-phenanthryl)-N-phenyl amino]biphenyl, 4,4'-bis[N-(8-fluoranthenyl)-N-phenylamino]biphenyl, 4,4'-bis[N-(2-pyrenyl)-N-phenyl amino]biphenyl, 4,4'-bis[N-(2-perylenyl)-N-phenylamino] biphenyl, 4,4'-bis[N-(1-choronenyl)-N-phenyl amino]biphenyl, 2,6-bis(di-p-tolylamino)naphthalene, 2,6-bis[di-(1-naphthyl)amino]naphthalene, 2,6-bis[N-(1-naphthyl)-N-(2-naphthyl)amino]naphthalene, 4,4'-bis[N,N-di(2-naphthyl) amino]terphenyl, 4,4'-bis{N-phenyl-N-[4-(1-naphthyl) phenyl]amino}biphenyl, 4,4'-bis[N-phenyl-N-(2-pyrenyl) amino]biphenyl, 2,6-bis[N,N-di-(2-naphthyl)amino] fluorene or 4,4'-bis(N,N-di-p-tolylamino)terphenyl, and bis (N-1-naphthyl)(N-2-naphthyl)amine, but is not limited thereto.

The hole injecting layer or the hole transporting layer may be formed by dispersing an organic compound in a polymer or by using a polymer derived from the organic compound. Furthermore, so-called i-conjugated polymers such as polyparaphenylenevinylene and a derivative thereof, hole transporting non-conjugated polymers such as poly(N-vinylcarbazole), or a i-conjugated polymer of polysilane, and the like can also be used.

The hole injecting layer may be formed by using a metal phthalocyanine such as copper phthalocyanine or a nonmetal phthalocyanine, or electrically conductive polymers such as a carbon film and polyaniline, or may also be formed by reacting the arylamine compound as an oxidizing agent with an Lewis acid.

The organic light emitting layer may comprise at least one light emitting layer. The organic layer may also comprise a plurality of light emitting layers of two or more layers. When two or more light emitting layers are included, the light emitting layers may also have a structure in which the light emitting layers are divided by an intermediate electrode layer having charge generating characteristics, or a charge generating layer (CGL) and the like.

The organic light emitting layer may emit, for example, Lambertian light. Specifically, the light emitting layer included in the organic light emitting layer may comprise a Lambertian light source. The Lambertian light source means a light source that satisfies the following equation 1:

$$I_\theta = I_0 \cos \theta \qquad \text{[Equation 1]}$$

In Equation 1 above, $I_\theta$ is the light intensity of the light emitted from the light source at an angle of θ with the normal, and $I_0$ is the light intensity of the light emitted from the light source. By comprising an optical film capable of extracting the light emitted from the Lambertian light source, the organic light emitting element of the present application can exhibit excellent light extraction efficiency.

The light emitting layer can be formed, for example, by using various fluorescent or phosphorescent organic materials known in the art. The material of the light emitting layer can be exemplified by a material of Alq series such as tris(4-methyl-8-quinolinolate)aluminum (III) (Alg3), 4-MAlq3 or Gaq3, a cyclopenadiene derivative such as C-545T ($C_{26}H_{26}N_2O_2S$), DSA-amine, TBSA, BTP, PAP-NPA, spiro-FPA, $Ph_3Si$ (PhTDAOXD) or PPCP (1,2,3,4,5-pentaphenyl-1,3-cyclopentadiene), DPVBi (4,4'-bis(2,2'-diphenylyinyl)-1,1'-biphenyl), distyrylbenzene or a derivative thereof, or DCJTB (4-(dicyanomethylene)-2-tert-butyl-6-(1,1,7,7-tetramethylj ulolidyl-9-enyl)-4H-pyran), DDP, AAAP, NPAMLI; a phosphorescent material such as Firpic, m-Firpic, N-Firpic, $bon_2Ir(acac)$, $(C_6)_2Ir(acac)$, $bt_2Ir(acac)$, $dp_2Ir(acac)$, $bzq_2Ir(acac)$, $bo_2Ir(acac)$, $F_2Ir(bpy)$, $F_2Ir(acac)$, $op_2Ir(acac)$, $ppy_2Ir(acac)$, $tpy_2Ir(acac)$, Flrppy(fac-tris[2-(4,5-difluorophenyl)pyridine-C'2,N]iridium(III)) or $Btp_2Ir$ (acac) (bis(2-(2'-benzo[4,5-a]thienyl)pyridinato-N,C3') iridium(acetylactonate)). The light emitting layer may also be a host-dopant system comprising the above material as a host and comprising perylene, distyrylbiphenyl, DPT, quinacridone, rubrene, BTX, ABTX or DCJTB, and the like as a dopant.

The light emitting layer can be formed by suitably adopting a kind that exhibits light emitting characteristics among electron accepting organic compounds or electron donating organic compounds to be described below.

In the technical field of the present application, various materials for forming a hole or electron injecting electrode layer and an organic light emitting layer, and the like, and a forming method thereof are known, and these methods can be all applied to the production of the organic light emitting element.

The organic light emitting element may further comprise an encapsulating structure. The encapsulating structure may be a protective structure that prevents foreign substances such as moisture and oxygen from being introduced into the organic light emitting layer of the organic light emitting element. The encapsulating structure may be a can structure such as a glass can or a metal can, or may be a film structure covering the top of the organic light emitting layer. The film-shaped encapsulating structure may be formed by applying a liquid phase material, which is cured by heat or ultraviolet (UV) irradiation, and the like, such as an epoxy resin, and curing it, or may be formed by a method of laminating a substrate and an upper substrate using an adhesive sheet or the like previously prepared in the form of a film with the epoxy resin or the like.

FIGS. 7 to 10 illustratively show an organic light emitting element comprising the optical films (100a, 100b, 100c) of the present application. As shown in FIGS. 7 to 10, an exemplary organic light emitting element comprises a structure in which a substrate (401), a transparent electrode layer (402), an organic light emitting layer (403) and a reflective electrode layer (404) are sequentially laminated, where the optical film (100a, 100b, 100c) can function as a light extracting layer by positioning it on the opposite surface (100a) of the transparent electrode layer (402) based on the substrate (401), the interface (100b) between the substrate (401) and the transparent electrode layer (402) and/or one side (100c) of the reflective electrode layer (404).

Advantageous Effects

The present application provides an optical film having excellent abrasion resistance and pressure resistance while having excellent light extraction efficiency, where the optical film can be used for light extraction.

BRIEF DESCRIPTION OF DRAWINGS

FIG. 1 is a schematic diagram for explaining a refractive index changing pattern.

FIGS. 2 and 3 are schematic diagrams for explaining a refractive index changing pattern.

FIG. 4 is a view for explaining that a refractive index is continuous in a refractive index changing pattern.

FIG. 5 illustrates an aspect of a refractive index changing pattern.

FIG. 6 is a schematic diagram for explaining an exemplary concentric figure unit of the present application.

FIGS. 7 to 10 are diagrams for explaining an exemplary organic electronic device.

FIGS. 11 and 12 are schematic diagrams of a process for manufacturing an optical film of Example 1.

FIG. 13 is a schematic diagram of a process for manufacturing an optical film of Example 2.

FIG. 14 is an optical microscope photograph of the surface of the optical film produced in Examples 1 and 2.

FIG. 15 is a graph showing shape analysis results of the surface of the optical film produced in Example 1.

FIG. 16 shows measurement results of the surface roughness of the optical film produced in Example 1.

FIG. 17 shows measurement results of the surface roughness of the optical film produced in Example 2.

FIG. 18 is graphs showing the light intensities of the organic light emitting element of Example 1 and the organic light emitting element of Comparative Example according to viewing angles.

FIG. 19 is graphs showing the light intensities of the organic light emitting element of Example 2 and the organic light emitting element of Comparative Example according to viewing angles.

MODE FOR INVENTION

Hereinafter, the contents of the present application will be described by way of examples. However, the scope of the present application is not limited to the following examples.

Example 1

Optical Film

The manufacturing process of the optical film of Example 1 will be described with reference to FIG. 11. An aluminum pattern was formed on a glass substrate having a thickness of about 300 μm to manufacture a mask (5). Specifically, the aluminum pattern had a plurality of perforations having a radius of about 0.1 mm and a distance of about 1.2 mm between the centers (see FIG. 12). The mask was placed on a photopolymer film (7) (Covestro, Bayfol HX) having a thickness of about 30 μm, a size of 4 cm×4 cm (width× height) and an average refractive index of about 1.5 for 532 nm wavelength light so that a separation distance was about 50 cm. The photopolymer film (7) was irradiated with a laser for about 250 seconds to produce a holographic optical element. Specifically, the laser light with a wavelength of about 532 nm and an intensity of about 700 μW irradiated from a light source (1) was divided into object light (3) and reference light (4) using a beam splitter (2). Subsequently, the photopolymer film (7) was irradiated with the object light (3) via the mask (5), but irradiated in a direction parallel to the normal of the photopolymer film (7). The photopolymer film was directly irradiated with the reference light (4) through the mirror (6), but irradiated at about 3 degrees with the normal of the photopolymer film. At this time, the holographic optical element was made to become a transmissive holographic optical element by irradiating the photopolymer film on the same plane with the object light and the reference light.

The holographic element was attached on a base layer of triacetyl cellulose (TAC) having a thickness of about 50 μm to produce an optical film.

Organic Light Emitting Element

The optical film was attached to the substrate side of the organic light emitting panel, in which the substrate (401), the transparent electrode layer (402), the organic light emitting layer (403) and the reflective electrode layer (404) were sequentially laminated to produce an organic light emitting element. As the organic light emitting panel, a commercially available product (manufactured by LG Display Co., Ltd.) was used.

Example 2

An optical film and an organic light emitting element were produced in the same manner as in Example 1, except that the transmissive holographic optical element was produced by irradiating the photopolymer film with the object light divided through the beam splitter via the mask so as to form about 30 degrees with the normal of the photopolymer film and directly irradiating the photopolymer film with the reference light through the mirror so as to form about 33 degrees with the normal of the photopolymer film. The manufacturing process of the optical film of Example 2 was briefly shown in FIG. 13.

Comparative Example

An organic light emitting element, in which any optical film was not laminated, was prepared.

Test Example

For the holographic elements produced in Examples 1 and 2, the diffraction efficiency of the element was measured using a plurality of light sources (wavelengths of 632 nm and 532 nm) and a photodiode detector. The maximum refractive index of the high-refraction region of the holographic element calculated through the above-described diffraction efficiency was about 1.52, and the minimum refractive index was about 1.48 (both of Examples 1 and 2 are the same). In addition, it could be deduced that in that the size of the perforations in the mask used upon producing the holographic optical element was about 1.2 mm, both of the diameter of the refractive index changing region and the distance between the centers of the refractive index changing regions in the element were 1.2 mm (both of Examples 1 and 2 are the same).

The surface shapes of the holographic optical elements produced in Examples 1 and 2 were analyzed using a VK-X200 instrument from Keyence. At this time, the analysis was performed on the region where the width of the holographic optical element was about 282.9 μm and the height was about 200 μm.

Optical microscope photographs of the surfaces of the holographic optical elements produced in Examples using this instrument were shown in FIG. 14 ((a): Example 1 and (b): Example 2), and the surface shape analysis results of the relevant elements were shown in FIG. 15 ((a): Example 1 and (b): Example 2). FIG. 16 shows the surface roughness curve of the optical element of Example 1 measured using the instrument. Specifically, FIG. 16(a) shows a reference surface (indicated by an arrow) of the surface roughness curve of the relevant optical element, and FIG. 16(b) shows the roughness curve obtained with respect to the relevant reference surface. As a result of analysis of the roughness curve, the surface roughness of the optical element of Example 1 was 0.076 μm.

FIG. 17 shows the surface roughness curve of the optical element of Example 2 measured using the instrument. Specifically, FIG. 17(a) shows a reference line (indicated by a white line) of the surface roughness curve of the relevant optical element, and FIG. 17(b) shows the roughness curve obtained with respect to the relevant reference surface. As a result of analysis of the roughness curve, the surface roughness of the optical element of Example 2 was 0.070 μm.

The intensities of light emitted from the organic light emitting elements produced in Examples 1 and 2 or Comparative Example according to angles were measured using a measuring instrument IS-SA-13-1-220V from Radiant Imaging.

1. Light Extraction Rate Calculation

The light extraction rate was calculated by the following equation.

Light extraction rate (%)=(total light intensity of optical film−total light intensity of organic light emitting device)×100/total light intensity of organic light emitting device [Equation 1]

Here, the total light intensity is the total sum of the light intensities within the range of −82.5 degrees to 82.5 degrees based on the normal direction of the organic light emitting element or the optical film.

2. Calculation of Front Light Intensity Increase Rate

The front light intensity increase rate was calculated by the following equation 2.

Front light intensity increase rate=(front light intensity of optical film−front light intensity of organic light emitting device)×100/front light intensity of organic light emitting device [Equation 2]

Here, the front light intensity is a light intensity at an angle of 0 degrees based on the normal direction of the organic light emitting element or the optical film.

The light intensities of the organic light emitting elements of Examples 1 and 2 and Comparative Example according to viewing angles were shown in FIGS. 18 and 19. As shown in FIGS. 18 and 19, it can be confirmed that the organic light emitting elements of Examples 1 and 2, to which the optical film of the present application is applied, exhibit excellent light intensities in the viewing angle range of −82.5 degrees to 82.5 degrees as compared to Comparative Example. Particularly, it can be seen that in Example 1, the front light intensity increase rate is particularly high and in Example 2, the light intensity increase rate at a viewing angle of about 30 degrees and a viewing angle of about −30 degrees is particularly high. Accordingly, it can be inferred that based on the normal of the relevant element, the refractive index changing unit regions in the holographic optical element of Example 1 are formed in parallel thereto and the refractive index changing unit regions in the holographic optical element of Example 2 are in a form tilted by about 30 degrees.

The light extraction rate of Example 1 was found to be improved by about 16.4% as compared to Comparative Example, and the front light intensity increase rate was found to be improved by about 14.1% as compared to Comparative Example. The light extraction rate of Example 2 was found to be improved by about 4% as compared to Comparative Example, and the front light intensity increase rate was found to be improved by about 9% as compared to Comparative Example. Through Examples and Comparative Example above, it can be confirmed that the optical film of the present application has excellent light extraction rate and front light intensity increase rate even though the film is free from internal and external bending.

The invention claimed is:

1. An optical film comprising a holographic optical element in which a refractive index changing pattern is recorded,
wherein the refractive index changing pattern includes a refractive index changing unit region in which a refractive index varies along the plane direction, and the refractive index changing unit region comprises at least one high-refraction unit region and at least one low-refraction unit region,
wherein the plane direction is a direction parallel to the plane of the optical film having the maximum area,
wherein the holographic optical element comprises a photosensitive material,
wherein the refractive index continuously changes in a sinusoidal waveform in the refractive index changing unit region, and
wherein the refractive index changing unit region comprises a plurality of high-refraction unit regions and a plurality of low-refraction unit regions, the local maximum refractive index of the high-refraction unit regions decreases in the direction away from the center of the refractive index changing unit region along the plane direction, or the local minimum refractive index of the low-refraction unit regions increases in the direction away from the center of the refractive index changing unit region along the plane direction.

2. The optical film according to claim 1, wherein the high-refraction unit region and the low-refraction unit region share the same center.

3. The optical film according to claim 1, wherein the high-refraction unit region and the low-refraction unit region are alternately and repeatedly disposed in the direction away from the center of the refractive index changing unit region along the plane direction.

4. The optical film according to claim 3, wherein a difference between a radius of the high-refraction unit region and a radius of the low-refraction unit region adjacent to each other decreases in the direction away from the center of the refractive index changing unit region along the plane direction.

5. The optical film according to claim 4, comprising a plurality of refractive index changing unit regions.

6. The optical film according to claim 5, comprising at least three refractive index changing unit regions, wherein a line connecting the respective center points of the refractive index changing unit regions adjacent to each other forms a polygon.

7. The optical film according to claim 5, wherein the refractive index changing unit region has a radius in a range of 0.2 mm to 6 mm.

8. The optical film according to claim 1, wherein the maximum refractive index of the high-refraction unit region is in a range of 1.3 to 1.7.

9. The optical film according to claim 1, wherein the minimum refractive index of the low-refraction unit region is in a range of 1.2 to 1.6.

10. The optical film according to claim 1, wherein the average refractive index of the optical film is in a range of 1.3 to 1.8.

11. The optical film according to claim 1, wherein the optical film has surface roughness of less than 1 μm.

12. The optical film according to claim 1, wherein the optical film has a thickness in a range of 3 μm to 300 μm.

13. The optical film according to claim 1, wherein the holographic optical element is a transmissive holographic optical element.

14. An organic light emitting element comprising the optical film of claim 1 and an organic light emitting panel.

15. The organic light emitting element according to claim 14, wherein the organic light emitting panel comprises a substrate, and a transparent electrode layer; an organic light emitting layer; and a reflective electrode layer, which are sequentially provided on one side of the substrate, and the optical film is disposed on the surface of the substrate adjacent to the transparent electrode layer or on the opposite surface of the surface of the substrate adjacent to the transparent electrode layer or on both.

16. The organic light emitting element according to claim 15, wherein the organic light emitting layer emits Lambertian light.

* * * * *